United States Patent
Huang et al.

(10) Patent No.: US 6,593,232 B1
(45) Date of Patent: Jul. 15, 2003

(54) PLASMA ETCH METHOD WITH ENHANCED ENDPOINT DETECTION

(75) Inventors: Yu-Chun Huang, Hualien (TW); Tsung Chuan, Tainan (TW); Albert Chen, Yungkang (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/190,253

(22) Filed: Jul. 5, 2002

(51) Int. Cl.[7] .......................................... H01L 21/4763
(52) U.S. Cl. .................. 438/637; 438/710; 438/723
(58) Field of Search ............................... 438/634, 637, 438/706, 710, 723

(56) References Cited

U.S. PATENT DOCUMENTS

| | | | |
|---|---|---|---|
| 5,242,532 A | 9/1993 | Cain | 216/60 |
| 6,168,726 B1 * | 1/2001 | Li et al. | 216/79 |
| 6,211,092 B1 | 4/2001 | Tang et al. | 438/719 |
| 6,297,163 B1 | 10/2001 | Zhu et al. | 438/707 |
| 6,297,168 B1 * | 10/2001 | Shieh et al. | 438/723 |
| 6,387,287 B1 * | 5/2002 | Hung et al. | 217/67 |

* cited by examiner

Primary Examiner—T. N. Quach
(74) Attorney, Agent, or Firm—Tung & Associates

(57) ABSTRACT

A plasma etch method for etching a silicon oxide containing material layer with respect to a silicon nitride etch stop layer employs an etchant gas composition comprising octafluorocyclobutane and oxygen, without a carbon and oxygen containing gas. An endpoint within the plasma etch method is determined by monitoring the concentration of the carbon and oxygen containing gas. The plasma etch methods provides for enhanced endpoint detection.

13 Claims, 2 Drawing Sheets

PLASMA ETCH METHOD WITH ENHANCED ENDPOINT DETECTION

BACKGROUND OF THE INVENTION

1. Field of the Invention

The present invention relates generally to plasma etch methods employed for fabricating microelectronic products. More particularly, the present invention relates to plasma etch methods employed for efficiently fabricating microelectronic products.

2. Description of the Related Art

Common in the art of microelectronic product fabrication is the use of plasma etch methods. Plasma etch methods often provide efficient methods for etching various types of materials within microelectronic products.

While plasma etch methods are clearly desirable and often essential for fabricating microelectronic products, plasma etch methods are nonetheless not entirely without problems. In that regard, it is often difficult to provide plasma etch methods with enhanced endpoint detection.

It is thus towards the goal of providing plasma etch methods with enhanced endpoint detection that the present invention is directed.

Various plasma etch methods having desirable properties have been disclosed in the art of microelectronic fabrication.

Included but not limiting among the plasma etch methods are plasma etch methods disclosed within: (1) Cain, in U.S. Pat. No. 5,242,532 (a two step plasma etch method and related endpoint detection method); (2) Tang et al., in U.S. Pat. No. 6,211,092 (a counterbore plasma etch method applicable to dual damascene structures); and (3) Zhu et al., in U.S. Pat. No. 6,297,163 (an additional plasma etch method applicable to dual damascene structures).

Desirable for microelectronic product fabrication are additional plasma etch methods with enhanced endpoint detection.

It is towards the foregoing object that the present invention is directed.

SUMMARY OF THE INVENTION

A first object of the present invention is to provide a plasma etch method for etching a microelectronic layer.

A second object of the present invention is to provide a plasma etch method in accord with the first object of the present invention, wherein the plasma etch method provides for enhanced endpoint detection.

In accord with the objects of the present invention, the present invention provides a method for etching a silicon oxide containing layer with respect to a silicon nitride etch stop layer.

To practice the present invention, there is first provided a substrate having formed thereover a silicon nitride etch stop layer in turn having formed thereupon a silicon oxide containing layer. There is then etched the silicon oxide containing layer while employing a plasma etchant gas composition comprising octafluorocyclobutane and oxygen without an added carbon and oxygen containing gas. Finally, there is determined an endpoint within the plasma etch method by monitoring a change in concentration of the carbon and oxygen containing gas.

The present invention provides enhanced endpoint detection within a plasma etch method for etching a microelectronic layer.

The present invention realizes the foregoing object within the context of etching a silicon oxide containing layer with respect to a silicon nitride etch stop layer by: (1) etching the silicon oxide containing layer while employing a plasma etch method employing an etchant gas composition comprising octafluorocyclobutane and oxygen without an added carbon and oxygen containing gas; and then (2) determining an endpoint within the plasma etch method by monitoring a change in concentration of the carbon and oxygen containing gas.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides for enhanced endpoint detection within a plasma etch method for etching a microelectronic layer.

The present invention realizes the foregoing object within the context of etching a silicon oxide containing layer with respect to a silicon nitride etch stop layer by: (1) etching the silicon oxide containing layer while employing a plasma etch method employing an etchant gas composition comprising octafluorocyclobutane and oxygen without an added carbon and oxygen containing gas; and then (2) determining an endpoint within the plasma etch method by monitoring a change in concentration of the carbon and oxygen containing gas.

FIG. 1 to FIG. 4 show a series of schematic cross-sectional diagrams illustrating the results of progressive stages of fabricating, in accord with a preferred embodiment of the present invention, a dual damascene structure within a microelectronic product.

Figure 1:
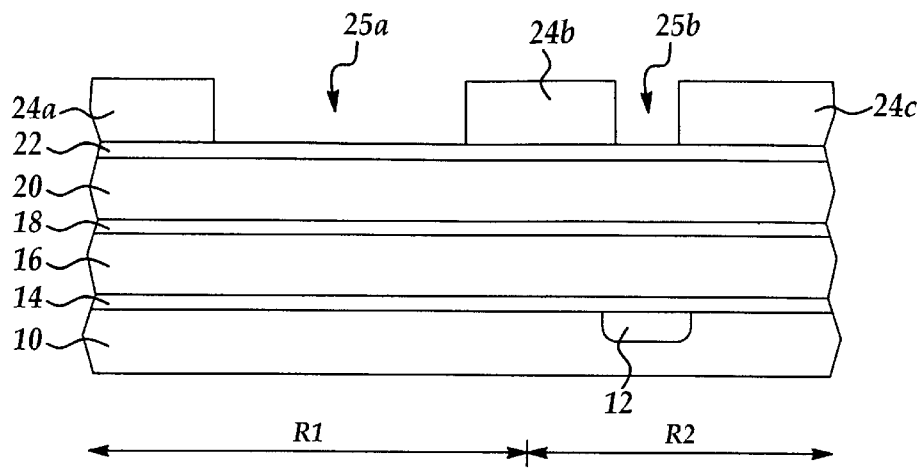
FIG. 1, FIG. 2, FIG. 3 and FIG. 4 show a series of schematic cross-sectional diagrams illustrating the results of progressive stages of fabricating, in accord with a preferred embodiment of the present invention, a dual damascene structure within a microelectronic product.

FIG. 1 shows a schematic cross-sectional diagram of the microelectronic product at an early stage in its fabrication in accord with the present invention.

Shown in FIG. 1, in a first instance, is a substrate 10 having formed therein a contact region 12. Within FIG. 1, the substrate 10 is divided into a peripheral region R1 which does not include the contact region 12 and an active region R2 which does include the contact region 12. The peripheral region R1 may include a kerf (i.e., scribe line) region or other non-product region of the substrate 10.

Within the present invention, the substrate 10 may be employed within a microelectronic product selected from the group including but not limited to integrated circuit products, ceramic substrate products and optoelectronic products. More typically, the substrate 10 is employed within a semiconductor integrated circuit product.

Although not specifically illustrated within the schematic cross-sectional diagram of FIG. 1, the substrate 10 may consist of a substrate alone as employed within the microelectronic product. Alternatively, the substrate 10 may comprise a substrate as employed within the microelectronic product, wherein the substrate has formed thereupon and/or thereover any of several additional layers as are conventional within the microelectronic product within which is employed the substrate 10. Such additional layers may be formed from microelectronic materials including but not limited to conductor materials, semiconductor materials and dielectric materials.

In addition, and although also not specifically illustrated within the schematic cross-sectional diagram of FIG. 1, the substrate 10 may have formed therein and/or thereupon microelectronic devices as are conventional within the microelectronic product within which is employed the substrate 10. Such devices may include but are not limited to resistors, transistors, diodes and capacitors.

Within the present invention the contact region 12 is typically either a semiconductor contact region (under circumstances where the substrate 10 consists of a semiconductor substrate) or a conductor contact region (under circumstances where the substrate 10 is employed within any of the several above microelectronic fabrications).

FIG. 1 also shows a series of five blanket layers formed upon or over the substrate 10 having formed therein the contact region 12. The series of five blanket layers includes: (1) a blanket first barrier layer 14 formed upon the substrate 10 including the contact region 12; (2) a blanket first dielectric layer 16 formed upon the blanket first barrier layer 14; (3) a blanket second etch stop layer 18 formed upon the blanket first dielectric layer 16; (4) a blanket second dielectric layer 20 formed upon the blanket second etch stop layer 18; and (5) a blanket planarizing stop layer 22 formed upon the blanket second dielectric layer 20. Finally, FIG. 1 illustrates a series of patterned photoresist layers 24a, 24b and 24c formed upon the blanket planarizing stop layer 22. The series of patterned photoresist layers 24a, 24b and 24c defines a first aperture 25a formed over the peripheral region R1 of the substrate 10 and a second aperture 25b formed over the contact region 12 within the active region R2 of the substrate 10.

Within the present invention, each of the blanket first etch stop layer 14 and the blanket second etch stop layer 18 is formed of a silicon nitride etch stop material as is otherwise conventional in the art of microelectronic fabrication. Typically, each of the blanket first etch stop layer 14 and the blanket second etch stop layer 18 is formed to a thickness of from about 200 to about 600 angstroms.

Within the present invention, the blanket planarizing stop layer 22 is typically and preferably formed of a planarizing stop material of different material composition than the blanket first etch stop layer 14 and the blanket second etch stop layer 18. Preferably, the blanket planarizing stop layer 22 is formed of a silicon oxynitride planarizing stop material, which also serves as an anti-reflective coating material, formed to a thickness of from about 400 to about 700 angstroms.

Within the present invention, each of the blanket first dielectric layer 16 and the blanket second dielectric layer 20 is formed of a silicon oxide containing dielectric material. Such silicon oxide containing dielectric materials may include, but are not limited to silicon oxide, doped silicate glasses (such as boron, phosphorus and fluorine doped silicate glasses) and silsesquioxane materials (such as but not limited to hydrogen silsesquioxane and methyl silsesquioxane materials). More typically and preferably, each of the blanket first dielectric layer 16 and the blanket second dielectric layer 20 is formed of a fluorosilicate glass (FSG) silicon oxide containing dielectric material, formed to a thickness of from about 3400 to about 5000 angstroms.

Within the present invention, the series of patterned photoresist layers 24a, 24b and 24c may be formed of photoresist materials as are conventional in the art of microelectronic fabrication. Such photoresist materials may include, but are not limited to, positive photoresist materials and negative photoresist materials. Typically, each of the pair of patterned photoresist layers 24a, 24b and 24c is formed to a thickness of from about 4000 to about 10000 angstroms, to define the first aperture 25a of linewidth from about 0.2 to about 0.5 microns and the second aperture 25b of linewidth from about 0.15 to about 0.25 microns.

Figure 2:
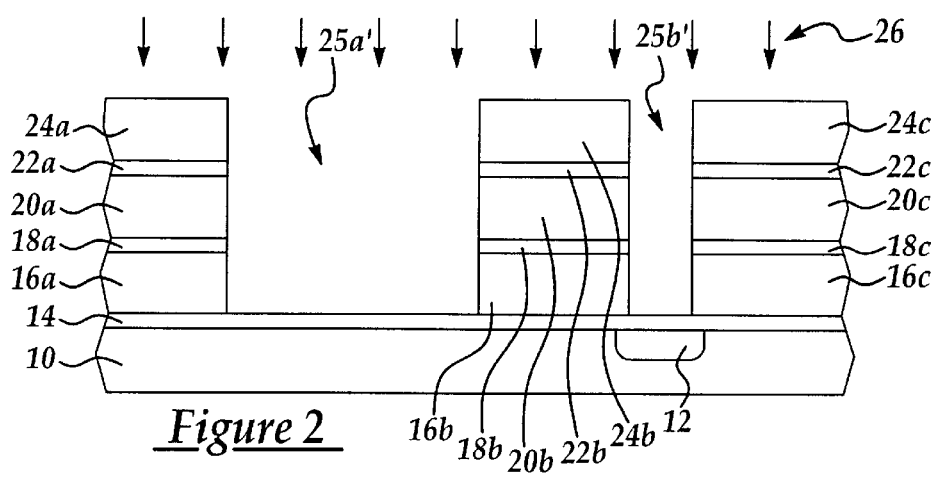

FIG. 2, illustrates the results of etching the microelectronic product of FIG. 1 within a first etching plasma 26 while employing the series of patterned photoresist layers 24a, 24b and 24c as an etch mask layer. Within FIG. 2, the blanket planarizing stop layer 22, the blanket second dielectric layer 20, the blanket second etch stop layer 18 and the blanket first dielectric layer 16 are sequentially etched to form therefrom a corresponding series of patterned planarizing stop layers 22a, 22b and 22c, series of patterned second dielectric layers 20a, 20b and 20c, series of patterned second etch stop layers 18a, 18b and 18c and series of patterned first dielectric layers 16a, 16b and 16c. The foregoing series of patterned layers define an extended first aperture 25a' and an extended second aperture 25b', each reaching the blanket first etch stop layer 14.

Within the present invention, the first etching plasma 26 employs: (1) a first breakthrough etchant gas composition for etching through the blanket planarizing stop layer 22; (2) a first main etchant gas composition for etching through the blanket second dielectric layer 20; (3) a second breakthrough etchant gas composition for etching through the blanket second etch stop layer 18; and (4) a second main etchant gas composition for etching through the blanket first dielectric layer 16.

The first breakthrough etchant gas composition and the second breakthrough etchant gas composition are generally identical and comprise or consist of carbon tetrafluoride ($CF_4$), oxygen ($O_2$) and argon (Ar) etchant gases. Typically, the first breakthrough etch and the second breakthrough etch employ (with respect to at least an eight inch diameter substrate: (1) a reactor chamber pressure of from about 35 to about 45 mtorr; (2) a radio frequency source power of from about 800 to about 1200 watts; (3) a substrate 10 (and overlying layers) temperature of from about 40 to about 80 degrees centigrade; (4) a carbon tetrafluoride flow rate of from about 60 to about 100 standard cubic centimeters per minute (sccm); (5) an oxygen flow rate of from about 15 to about 25 sccm; and (6) an argon flow rate of from about 130 to about 190 sccm.

Typically, each of the first breakthrough etch and the second breakthrough etch is a timed etch having an etch time of from about 15 to about 35 seconds when etching through each of the blanket planarizing stop layer 22 and the blanket second etch stop layer 18. The use of the oxygen flow of from about 5 to about 15 sccm within the first breakthrough etch and the second breakthrough etch has been found to be beneficial in reducing the phenomenon of RIE lag, which might otherwise provide for inhomogeneous sidewall profiles of the extended first aperture 25a' and the extended second aperture 25b'.

Within the present invention, each of the first main etchant gas composition and the second main etchant gas composition may also be identical. Each of the first main etchant gas composition and second main etchant gas composition comprises or consists of octafluorocyclobutane ($C_4F_8$) and oxygen, typically with argon as a sputter etch component, and without an added carbon and oxygen containing gas such as carbon monoxide (CO) or carbon dioxide ($CO_2$). Typically, the first main etch and the second main etch employ with respect to at least an eight inch diameter substrate: (1) a reactor chamber pressure of from about 25 to about 35 mtorr; (2) a radio frequency source power of from about 1400 to about 2200 watts; (3) a substrate 10 (and overlying layers) temperature of from about 40 to about 80 degrees centigrade; (4) an octafluorocyclobutane flow rate of from about 15 to about 25 sccm; (5) an oxygen flow rate of from about 8 to about 12 sccm; and (6) an argon flow rate of from about 250 to about 350 sccm.

Within the present invention, the presence of oxygen and the absence of an added carbon and oxygen containing gas provides for an enhanced endpoint detection when reaching either the blanket second etch stop layer 18 with the first main etch or the blanket first etch stop layer 14 with the second main etch. Within the present invention, endpoint detection is effected by measurement of a concentration of an intrinsically generated but not added carbon and oxygen gas, such as carbon dioxide or more particularly carbon monoxide. Such measurement is typically effected employing optical emission spectroscopy (OES). A carbon monoxide emission wavelength at 226 nanometers has been determined particularly useful within the present invention. In addition, since the present invention provides for simultaneous etching of the first extended aperture 25a' within the peripheral region R1 and the second extended aperture 25b' within the active region R2, endpoint detection sensitivity is further enhanced since open etched area is increased.

Figure 3:
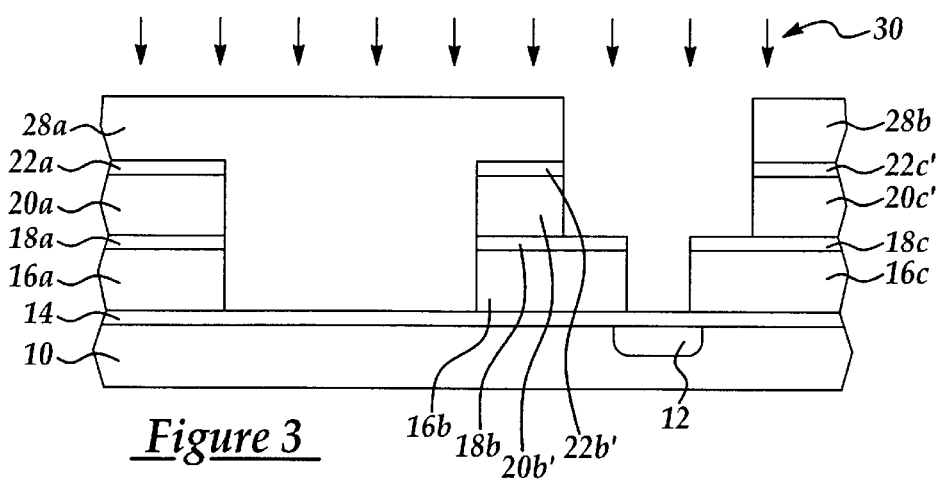

FIG. 3 illustrates the results of further processing of the microelectronic product whose schematic cross-sectional diagram is illustrated in FIG. 2.

Within FIG. 3, the series of patterned first photoresist layers 24a, 24b and 24c has been stripped from the series of patterned planarizing stop layers 22a, 22b and 22c. They may be stripped employing methods and materials as are conventional in the art of microelectronic product fabrication. Next, a pair of patterned second photoresist layers 28a and 28b is formed to define the location of a trench overlapping the extended second aperture 25b'. Finally, the pair of patterned planarizing stop layers 22b and 22c and the pair of patterned second dielectric layers 20b and 20c are etched with a second etching plasma 30 to form a pair of twice patterned planarizing stop layers 22b' and 22c' and a pair of twice patterned second dielectric layers 20b' and 20c' which define the trench which overlaps with the extended second aperture 25b'.

Within the present invention, the second etching plasma 30 employs a third breakthrough etchant gas composition for etching through the pair of patterned planarizing stop layers 22b and 22c and a third main etchant gas composition for etching through the pair of patterned second dielectric layers 20b and 20c. The third breakthrough etchant gas composition may be identical to the first and second breakthrough etchant gas compositions. The third main etchant gas composition may be identical to the first and second main etchant gas compositions.

Figure 4:
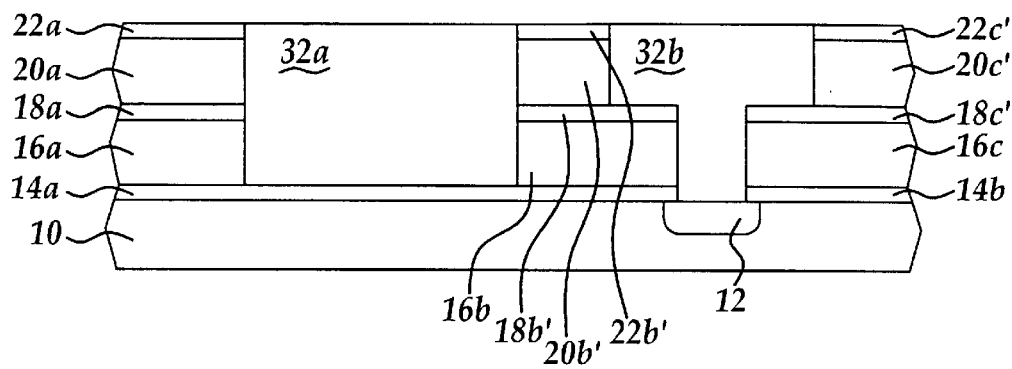

FIG. 4 illustrates the results of further processing of microelectronic product whose schematic cross-sectional diagram is illustrated in FIG. 3.

Within FIG. 4, the pair of patterned second etch stop layers 18b and 18c, and the blanket first etch stop layer 14, have been patterned to form a pair of twice patterned second etch stop layers 18b' and 18c' and a pair of patterned first etch stop layers 14a and 14b, such as to form from the trench and the extended second aperture 25b' a dual damascene aperture which comprises a trench overlapping a via which accesses the contact region 12. In addition, the pair of patterned second photoresist layers 28a and 28b has been stripped from the patterned planarizing stop layer 22a and the pair of twice patterned planarizing stop layers 20b' and 20c'. Finally, FIG. 4 illustrates a dummy conductor layer 32a formed into the extended first aperture 25a' and a contiguous patterned conductor interconnect and conductor stud layer 32b formed into the dual damascene aperture.

Each of the foregoing process steps may be undertaken employing methods and materials as are conventional in the art of microelectronic fabrication.

FIG. 4 illustrates a microelectronic product fabricated in accord with the preferred embodiment of the present invention. The microelectronic product has formed therein a dual damascene aperture through a pair of silicon oxide containing layers and separated by silicon nitride etch stop layers. At least a portion of the dual damascene aperture is formed with enhanced endpoint detection by employing: (1) a plasma etch method employing an etchant gas composition comprising octafluorocyclobutane and oxygen without an added carbon and oxygen containing gas; and (2) monitoring an endpoint with respect to a silicon nitride etch stop layer by measuring a carbon and oxygen containing gas concentration.

EXAMPLE

A semiconductor product was fabricated in accord with the preferred embodiment of the invention. The semiconductor product comprised an eight inch semiconductor substrate having formed thereover a silicon nitride etch stop layer formed to a thickness of about 300 angstroms. In turn, the silicon nitride etch stop layer had formed thereupon a fluorosilicate glass (FSG) dielectric layer formed to a thickness of about 4000 angstroms. In turn, the FSG dielectric layer had formed thereupon a silicon oxynitride layer formed to a thickness of about 600 angstroms. Finally, the silicon oxynitride layer had formed thereupon a series of patterned photoresist layers defining apertures of either about 0.15 micron linewidth or about 0.5 micron linewidth.

The semiconductor product was plasma etched within a plasma employing an etchant gas composition consisting of: (1) octafluorocyclobutane at a flow rate of about 20 sccm; (2) oxygen at a flow rate of about 10 sccm; and (3) argon at a flow rate of about 300 sccm. The plasma etch method also employed: (1) a reactor chamber pressure of about 30 mtorr; (2) a radio frequency source power of about 1800 watts; and (3) a semiconductor substrate (and overlying layers) temperature of about 60 degrees centigrade.

Figure 5:
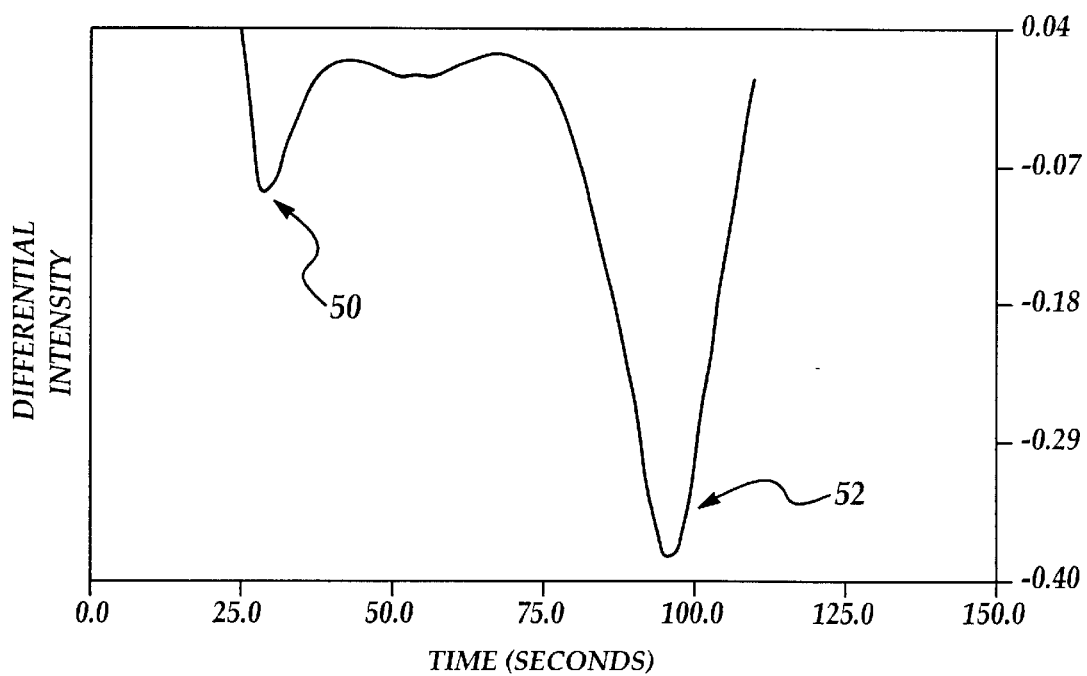
FIG. 5 shows a graph of Derivative Intensity versus Time illustrating enhanced endpoint detection in accord with the present invention.

FIG. 5 shows a graph of Differential Intensity versus Time for plasma etching the semiconductor product as described above.

Within FIG. 5, the peak which corresponds with reference numeral 50 corresponds with a breakthrough of the silicon oxynitride layer and the peak which corresponds with reference numeral 52 corresponds with reaching and breakthrough of the silicon nitride etch stop layer. An endpoint for etching to the silicon nitride etch stop is enhanced and readily discernable within FIG. 5.

The preferred embodiment and example of the present invention are illustrative of the present invention rather than limiting of the present invention. Structural and dimensional modifications may be made to a microelectronic product in accord with the preferred embodiment and example of the present invention, while still providing a method in accord with the present invention, further in accord with the accompanying claims.

What is claimed is:

1. A method for etching a silicon oxide containing layer with respect to a silicon nitride etch stop layer comprising:

providing a substrate;

forming over the substrate a silicon nitride etch stop layer;

forming upon the silicon nitride etch stop layer a silicon oxide containing layer;

etching the silicon oxide containing layer while employing a plasma etchant gas composition comprising octafluorocyclobutane and oxygen without an added carbon and oxygen containing gas; and determining an endpoint within the plasma etch method by monitoring a change in concentration of the carbon and oxygen containing gas.

2. The method of claim 1 wherein the substrate is employed within a microelectronic product selected from the group consisting of integrated circuit products, ceramic substrate products and optoelectronic products.

3. The method of claim 1 wherein the silicon oxide containing layer is formed from a material selected from the group consisting of silicon oxide, doped silicate glasses and silsesquioxane materials.

4. The method of claim 1 wherein the carbon and oxygen containing gas is selected from the group consisting of carbon monoxide and carbon dioxide.

5. The method of claim 1 wherein the carbon and oxygen containing gas is carbon monoxide.

6. The method of claim 1 wherein the etchant gas composition consists of octafluorocyclobutane, oxygen and argon.

7. A method for forming an aperture within a silicon oxide containing layer comprising:

providing a substrate;

forming over the substrate a silicon nitride etch stop layer;

forming upon the silicon nitride etch stop layer a silicon oxide containing layer;

forming over the silicon oxide containing layer a patterned mask layer;

etching the silicon oxide containing layer while employing a plasma etchant gas composition comprising octafluorocyclobutane and oxygen and argon without an added carbon and oxygen containing gas to form an aperture within the silicon oxide containing layer; and determining an endpoint within the plasma etch method by monitoring a change in concentration of the carbon and oxygen containing gas.

8. The method of claim 7 wherein the substrate is employed within a microelectronic product selected from the group consisting of integrated circuit products, ceramic substrate products and optoelectronic products.

9. The method of claim 7 wherein the silicon oxide containing layer is formed from a material selected from the group consisting of silicon oxide, doped silicate glasses and silsesquioxane materials.

10. The method of claim 7 wherein the carbon and oxygen containing gas is selected from the group consisting of carbon monoxide and carbon dioxide.

11. The method of claim 7 wherein the carbon and oxygen containing gas is carbon monoxide.

12. The method of claim 7 wherein the patterned mask layer defines the aperture within an active region of the substrate and a second aperture within a peripheral region of the substrate.

13. The method of claim 7 wherein the etchant gas composition consists of octafluorocyclobutane, oxygen and argon.

* * * * *